United States Patent
Giacomini

[19]

[11] Patent Number: 5,900,779

[45] Date of Patent: May 4, 1999

[54] DIFFERENTIAL TRANSIMPEDANCE AMPLIFIER

[75] Inventor: Joseph D. Giacomini, Eagan, Minn.

[73] Assignee: VTC, Inc., Bloomington, Minn.

[21] Appl. No.: 08/873,411

[22] Filed: Jun. 12, 1997

Related U.S. Application Data

[60] Provisional application No. 60/022,483, Jun. 13, 1996.

[51] Int. Cl.$^6$ ...................................................... H03F 3/45
[52] U.S. Cl. ........................................... 330/252; 330/260
[58] Field of Search .............................. 330/69, 252, 260, 330/292

[56] References Cited

U.S. PATENT DOCUMENTS

| | | | |
|---|---|---|---|
| 4,232,271 | 11/1980 | Dobkin et al. | 330/260 X |
| 4,268,798 | 5/1981 | Reichart | 330/69 X |
| 5,627,494 | 5/1997 | Somerville | 330/260 X |

*Primary Examiner*—Steven Mottola
*Attorney, Agent, or Firm*—Kinney & Lange, P.A.

[57] ABSTRACT

A differential transimpedance amplifier with reduced input impedance and increased bandwidth having a pair of input contacts, a pair of summing transistors, a pair of feedback transistors, a pair of output resistors, a pair of feedback resistors, a first and a second node and a pair of output contacts. The input contacts each being connected to one or more sources of current that are to be summed and are connected to the pair of summing transistors. The pair of feedback transistors are connected to the pair of input contacts, the pair of feedback resistors and to the first node for differentially reducing the input impedance of the pair of summing transistors and to overcome voltage excursions at the pair of input contacts to increase the operational bandwidth of the transimpedance amplifier. The pair of output resistors are connected to the pair of summing transistors for converting the current sum for each input contact into a voltage level that is transmitted differentially by the pair of output contacts that are connected to the pair of summing transistors.

13 Claims, 1 Drawing Sheet

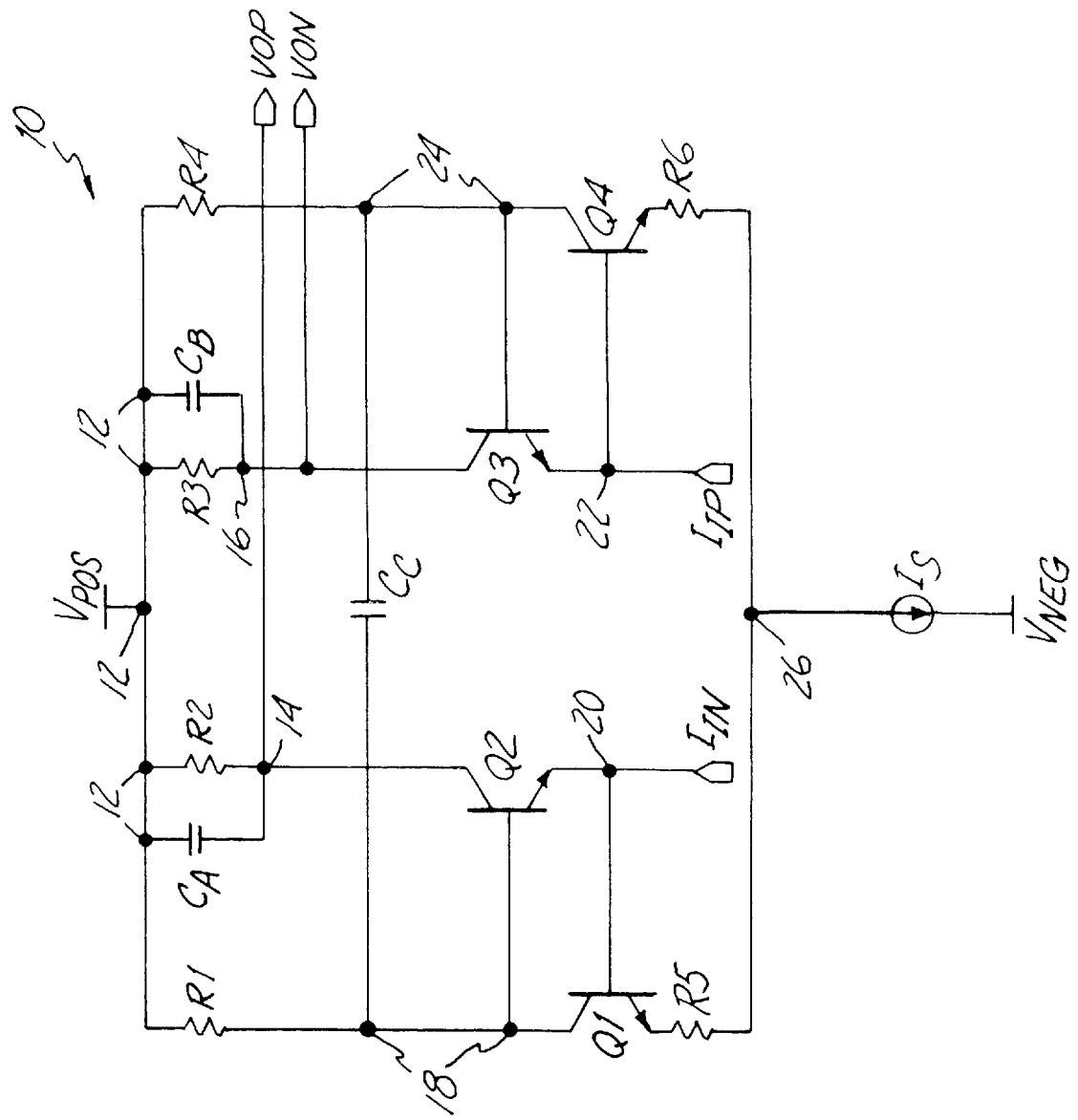

5,900,779

DIFFERENTIAL TRANSIMPEDANCE AMPLIFIER

This application claims the priority benefit of a provisional U.S. patent application having application Ser. No. 60/022,483, filed on Jun. 13, 1996.

BACKGROUND OF THE INVENTION

This invention pertains to a differential transimpedance amplifier. More particularly, it pertains to a high frequency low impedance differential transimpedance amplifier.

Transimpedance amplifiers convert a current level to a voltage level and are effective in various types of circuits providing easier circuit integration, more precise control and increased accuracy in performance. A typical use of a transimpedance amplifier is to sum currents as part of a frequency impulse response filter.

An ideal transimpedance amplifier has zero input impedance and infinite output impedance. This ensures that the entire current flows only across a load, or output resistor, to convert the current to a voltage level. By approaching zero input impedance and infinite output impedance, the performance of a transimpedance amplifier is improved.

Use of a transistor to function as the transimpedance amplifier to sum a number of currents is known in the art. The currents to be summed are generally connected together at the emitter of the transistor so that the total current flows across the load or output resistor connected to the collector of the transistor when the base of the transistor is properly biased. The load or output resistor is sized appropriately to effectively diminish any effect the output impedance of the transistor would have on the load or output resistor.

Use of a transistor in this configuration for summing a number of currents creates an input impedance equal to at least the base spreading resistance ($r_b$) divided by the transistors current gain and the incremental resistance of the emitter-base ($r_e$) for its bias condition. The resistance $r_e$ is usually much larger than $r_b$/Beta and therefore the input impedance is approximately equal to the resistance $r_e$ of the transistor. However, although small, the resistance $r_e$ will interact with parasitic capacitance which exists at the emitter of the summing transistor as a result of connecting together the current supplies to be summed as well as the capacitance that exists in the line. This interaction generates a voltage excursion or voltage level at the emitter node of the transistor as the parasitic capacitance charges or discharges in response to the interaction. The time constant associated with the parasitic capacitance charging and discharging creates a time delay to the circuit as not all of the current to be summed flows across the load or the output resistance located at the collector. This time constant decreases the frequency rate at which the circuit can accurately operate and thus decreases the bandwidth of the circuit.

To avoid this decrease in bandwidth and improve the accuracy of a transimpedance amplifier, the input impedance must be minimized to approximate ideal conditions (i.e. zero input impedance).

SUMMARY OF THE INVENTION

The present invention reduces the input impedance and increases the bandwidth of a differential transimpedance amplifier. The invention comprises a pair of input contacts, summing means, negative feedback means, a pair of output resistors and a pair of output contacts. The input contacts are connected to one or more sources of current that are to be summed as well as to the summing means which maintains the flow of current through the input contacts. The negative feedback means are connected differentially to the input contacts and the summing means for reducing the input impedance of the summing means and to overcome voltage excursions at the input contact which increases the operational bandwidth of the transimpedance amplifier. The pair of output resistors are connected to the summing means for converting the current sum for each input contact into a voltage level that is transmitted differentially by the pair of output contacts which are connected to the summing means.

BRIEF DESCRIPTION OF THE DRAWINGS

The figure is a circuit diagram of a preferred embodiment of the invention.

DETAILED DESCRIPTION OF THE PREFERRED EMBODIMENTS

The figure shows a transimpedance amplifier 10, which is a high frequency differential transimpedance amplifier with negative feedback. The transimpedance amplifier 10 includes a pair of input contacts $I_{IN}$ and $I_{IP}$, a pair of summing transistors Q2 and Q3, constant voltage references $V_{POS}$ and $V_{NEG}$, a pair of output resistors R2 and R3, a current source $I_S$, a pair of feedback transistors Q1 and Q4, a pair of feedback resistors R1 and R4, a pair of bias resistors R5 and R6, a pair of output contacts $V_{OP}$ and $V_{ON}$ and compensation capacitors $C_A$, $C_B$ and $C_C$.

The transimpedance amplifier 10 exhibits a high degree of symmetry due its differential nature. The transimpedance amplifier 10 can be viewed as two symmetrical circuits connected to $I_{IN}$ and $I_{IP}$ that interact and are connected together to produce outputs $V_{OP}$ and $V_{ON}$. In order to more clearly understand the interconnections of the transimpedance amplifier 10, the symmetrical portion of the circuit between $I_{IN}$ and $V_{OP}$ will be initially described followed by the symmetrical portion of the circuit between $I_{IP}$ and $V_{ON}$.

In a preferred embodiment, the input contact $I_{IN}$ is connected to one or more different sources of input current that are to be summed. $I_{IN}$ is also connected at node 20 to an emitter of the summing transistors Q2 and a base of the feedback transistor Q1. The summing transistor Q2 is further connected such that its base is connected at node 18 to a collector of the feedback transistor Q1 and one end of the feedback resistor R1 and its collector is connected at node 14 to one end of the output resistor R2 and the output contact $V_{OP}$. The opposite ends of the feedback resistor R1 and the output resistor R2 are connected to constant voltage reference $V_{POS}$ at node 12. The feedback transistor Q1 is further connected by its emitter to one end of the bias resistor R5. The bias resistor R5 is connected at its opposite end to current source $I_S$ at node 26. The compensation capacitor $C_A$ is preferably connected in parallel to the output resistor R2.

Similar to the input contact $I_{IN}$, the input contact $I_{IP}$ is connected to one or more different sources of input current that are to be summed. $I_{IP}$ is also connected at node 22 to an emitter of the summing transistor Q3 and to a base of the feedback transistor Q4. The summing transistor Q3 is further connected such that its base is connected at node 24 to a collector of the feedback transistor Q4 and one end of the feedback resistor R4, the collector of Q3 is connected at node 16 to one end of the output resistor R3 and the output contact $V_{ON}$. The opposite ends of the feedback resistor R4 and the output resistor R3 are connected to constant voltage reference $V_{POS}$ at node 12. The feedback transistor Q4 is further connected by its emitter to one end of the bias resistor R6. The bias resistor R6 is connected at its opposite end to current source $I_S$ at node 26. The compensation capacitor $C_B$ is preferably connected in parallel to the output resistor R3.

The two symmetrical portions of the transimpedance amplifier 10 are connected together at nodes 12 and 26 to create a differential transistor pair between the feedback transistors Q1 and Q4. The compensation capacitor $C_C$ is preferably connected across the collectors of the feedback transistors Q1 and Q4 at nodes 18 and 24. Due to the symmetry of the circuit, the circuit is best understood by considering one input contact and assuming $V_{POS}$ and $I_S$ to be held constant. While the following discussion will make reference to only $I_{IN}$, it is equally applicable to the input contact $I_{IP}$ and the corresponding symmetrical circuit connected to $I_{IP}$.

During operation of the transimpedance amplifier 10, the feedback transistor Q1 in conjunction with the feedback resistor RI creates a feedback loop to the summing transistor Q2. The feedback loop maintains the summing transistor Q2 in its active region so that virtually all of the current to be summed from the input contact $I_{IN}$ flows through the summing transistor Q2 and is converted into a voltage level across the output resistor R2. The feedback loop maintains the summing transistor Q2 in its active region by decreasing the input impedance at the input contact $I_{IN}$ of the transimpedance amplifier 10 and correcting for voltage excursions occurring at the input contact $I_{IN}$. The feedback loop corrects for the voltage excursions by adjusting the voltage level at the base of the summing transistor Q2. The voltage excursions generally occur due to finite resistance seen at the emitter of Q2.

Assuming $V_{POS}$ and $I_S$ are held constant, the intrinsic open loop input impedance (or resistance at direct current without the base of the feedback transistor Q1 connected to node 20) at $I_{IN}$ equals the small signal input resistance $r_e$ of the summing transistor Q2 plus the feedback resistor R1 divided by beta of the summing transistor Q2, or $r_{eQ2}+R1/\beta_{Q2}$. Closing the feedback loop by connecting the base of the feedback transistor Q1 to node 20, results in a decrease of the intrinsic input impedance by a factor of one over one plus the feedback open loop gain. The feedback open loop gain for this circuit is equal to the output resistor R1 divided by the sum of $r_{eQ1}$ and the bias resistor R5, or $R1/(r_{eQ1}+R5)$. Thus the intrinsic input impedance at $I_{IN}$ is equal to $(r_{eQ2}+R1/\beta_{Q2})/(1+R1/(r_{eQ1}+R5))$, or is reduced by a factor approximately equal to the open loop gain of the feedback loop.

With the feedback loop closed, the current variation through the feedback transistor Q1 is reduced. This results in nearly all of the current at $I_{IN}$ being transferred through the summing transistor Q2 and the output resistor R2. The transimpedance gain therefore is approximately equal to the resistance value of the output resistor R2.

With the feedback loop closed (which decreases the input impedance at $I_{IN}$), the voltage excursions at the input contact $I_{IN}$ are also decreased. Voltage excursions generally result from the interaction of the input impedance and the change in input current at the input $I_{IN}$. By decreasing the input impedance, less interaction with changing input can occur and voltage excursions are decreased. By decreasing the voltage excursions at $I_{IN}$, a more accurate sum of the currents and thus conversion to a voltage level is achieved, thereby improving the performance of the transimpedance amplifier 10.

To overcome voltage excursions that may still occur as a result of charging and discharging of parasitic capacitance in the line, a feedback loop is incorporated into the transimpedance amplifier 10 to correct for any voltage excursions and nullify their effect on the summing transistor Q2. This allows the transimpedance amplifier 10 to operate at a higher frequency or a wider bandwidth.

The feedback loop nullifies the effect of the voltage excursions on the summing transistor Q2 by appropriately adjusting the voltage at the base of the summing transistor Q2. Upon the occurrence of a voltage excursion at the input contact $I_{IN}$, current is drawn out of the input contact $I_{IN}$ lowering the base of the feedback transistor Q1. Lowering the base voltage of the feedback transistor Q1 also reduces the current flow through the feedback transistor Q1. The decrease in current through the feedback transistor Q1 creates less of a voltage drop across the feedback resistor R1, which increases the voltage level at node 18 and thus increases or adjusts the base voltage of the summing transistor Q2. The increase in base voltage of the summing transistor Q2 causes the base voltage of the feedback transistor Q1 to be pulled-up and thus reduces or overcomes the voltage excursion that caused the changed condition in the first place. By adjusting the base voltage of the summing transistor Q2 in this manner, the summing transistor Q2 continues to operate in its active region and the charging and discharging of parasitic capacitance associated with the voltage excursions is overcome without affecting the bandwidth or operational frequency of the circuit.

While the discussion of the circuit operation has been with respect $I_{IN}$, Q1, Q2 and their associated components, operation of the symmetrical circuit $I_{IP}$, Q4, Q3 and their associated components is similar to that above, respectively. The compensation capacitors $C_A$, $C_B$ and $C_C$ are preferably included to reduce the high frequency noise and to prevent oscillations or increase stability. In a preferred embodiment, the size of the compensation capacitors $C_A$, $C_B$ and $C_C$ are minimized while taking advantage of Miller multiplication to maximize circuit performance.

Combining the two half circuits through current source $I_S$ converts the main input impedance term from a single-ended impedance to a differential impedance and two single ended impedance terms. The differential term is controlled by the differential pair formed from the feedback transistors Q1 and Q4, the feedback resistors R1 and R4 and the bias resistors R5 and R6. Any change in input voltage between the input contacts $I_{IN}$ and $I_{IP}$ generates a change in the output current of the differential pair comprising the feedback transistors Q1 and Q4. The current change in the output of the differential feedback transistors Q1 and Q4 produces a voltage change which drives the base voltage of the summing transistors Q2 and Q3 in opposition to the initial change, thus reducing its effect.

The net differential input impedance is approximately equal to twice the single ended input impedance discussed earlier. Because resistors set the current in the differential pair of feedback transistors Q1 and Q4, any common mode voltage change at the base will produce a common mode current change in the outputs of Q1 and Q4 and provide some common mode control to the transimpedance amplifier 10. The differential pair of feedback transistors Q1 and Q4 will adjust the base voltages of the summing transistors Q2 and Q3 in accordance with the voltage levels of the input contacts $I_{IN}$ and $I_{IP}$. The voltage levels at the input contacts $I_{IN}$ and $I_{IP}$ will be adjusted to approximately one base-emitter voltage level above ground.

By use of the invention, a low impedance high frequency transimpedance amplifier is provided that overcomes voltage excursions and provides a wide bandwidth of operation.

In a preferred embodiment, the following component levels are used within the circuit. The constant voltage reference $V_{POS}$ is set to 5 volts and $V_{NEG}$ is set to ground. The output resistors R2 and R3 are equal to 2.0 kilohms, while the feedback resistors R1 and R4 are equal 10.0 kilohms and the bias resistors are equal to 100 ohms. Compensation capacitors $C_A$ and $C_B$ are equal to 0.1 picofarad and $C_C$ is equal to 0.85 picofarad. The summing transistors Q2 and Q3 are preferably matched to each other as are the feedback transistors Q1 and Q4.

Although the present invention has been described with reference to preferred embodiments, workers skilled in the art will recognize that changes may be made in form and detail without departing from the spirit and scope of the invention. For example, the constant current source node could be replaced with a bias voltage source and a resistor. Additionally the compensation capacitors could be connected across the collectors of the summing transistor and its corresponding feedback transistors rather than in parallel with the output resistors.

What is claimed is:

1. A differential transimpedance amplifier comprising:
   a pair of input contacts;
   a pair of output contacts;
   a pair of summing transistors each having an emitter connected directly to a different one of the input contacts;
   a pair of output resistors connected to the output contacts and to the pair of summing transistors; and
   a differential pair of feedback transistors which adjust base voltages of the summing transistors as a function of voltage levels at the input contacts.

2. A differential transimpedance amplifier comprising:
   a pair of input contacts;
   a pair of output contacts;
   a pair of summing transistors connected to the input contacts;
   a pair of output resistors connected to the output contacts and to the pair of summing transistors:
   a differential pair of feedback transistors which adjust base voltages of the summing transistors as a function of voltage levels at the input contacts; and
   a pair of feedback resistors connected to the pair of feedback transistors for setting the adjustment of the base voltages of the summing transistors as a function of voltage levels at the input contacts.

3. The differential transimpedance amplifier of claim 2, and further comprising:
   a first supply voltage connected to the pair of feedback resistors at an end opposite to the pair of feedback transistors and connected to the output resistors at an end opposite to the pair of summing transistors;
   a pair of bias resistors connected to the pair of feedback transistors; and
   a constant current source connected to the pair of bias resistors at an end opposite the pair of feedback transistors to differentially connect the pair of feedback transistors.

4. A differential transimpedance amplifier for providing a differential output voltage between a first and a second output contact as a function of a first input current through a first input contact and second input current through a second input contact, the amplifier comprising:
   first summing means connected to the first input contact for maintaining the flow of the first input current through the first input contact;
   second summing means connected to the second input contact for maintaining the flow of the second input current through the second input contact;
   a first feedback transistor having a base connected to the first input contact and the first summing means, an emitter connected to a first node and a collector connected to the first summing means for reducing the input impedance of the first summing means and to differentially overcome voltage excursions at the first input contact increasing the operational bandwidth of the amplifier;
   a first feedback resistor connected between the collector of the first feedback transistor and a second mode;
   second negative feedback means connected to the second input contact, the second summing means and the first node for reducing the input impedance of the second summing means and to differentially overcome voltage excursions at the second input contact increasing the operational bandwidth of the amplifier;
   a first output resistor connected between the second node and the first summing means for converting the first input current into a first voltage provided to the first output contact; and
   a second output resistor connected between the second node and the second summing means for converting the second input current into a second voltage provided to the second output contact.

5. The differential transimpedance amplifier of claim 4, wherein the first and the second summing means are each comprised of a summing transistor having an emitter connected to their respective input contact, a collector connected to their respective output resistor and a base connected to their respective negative feedback means.

6. The differential transimpedance amplifier of claim 4, wherein the second negative feedback means comprises:
   a second feedback transistor having a base connected to the emitter of the second summing transistor and a collector connected to the base of the second summing transistor; and
   a second feedback resistor connected between the collector of the second feedback transistor and the second node.

7. The differential transimpedance amplifier of claim 6, and further comprising:
   a current source connected to the first node;
   a first supply voltage connected to the second node;
   a first bias resistor connected between the first node and an emitter of the first feedback transistor; and
   a second bias resistor connected between the first node and an emitter of the second feedback transistor.

8. A differential transimpedance amplifier, the amplifier comprising:
   a first and a second input contact that a first and a second input current flows through respectively;
   a first and a second summing transistor, wherein an emitter of the first summing transistor is connected to the first input contact and an emitter of the second summing transistor is connected to the second input contact;
   a first and a second node;
   a first and a second output resistor, wherein the first output resistor is connected between the second node and a collector of the first summing transistor and the second output resistor is connected between the second node and a collector of the second summing transistor;

a first and a second feedback transistor, wherein a base and a collector of the first feedback transistor is connected to the emitter and a base of the first summing transistor, respectively, and a base and a collector of the second feedback transistor is connected to the emitter and a base of the second summing transistor, respectively;

a first and a second feedback resistor, wherein the first feedback resistor is connected between the collector of the first feedback transistor and the second node and the second feedback resistor is connected between the collector of the second feedback transistor and the second node;

a first and a second output contact, wherein the first output contact is connected to the collector of the first summing transistor and the second output contact is connected to the collector of the second summing transistor.

9. The differential transimpedance amplifier of claim 8, and further comprising:

a current source connected to the first node;

a first supply voltage connected to the second node; and a first and a second bias resistor, wherein the first bias resistor is connected between the first node an emitter of the first feedback transistor and the second bias resistor is connected between the first node an emitter of the second feedback transistor.

10. A transimpedance amplifier, the amplifier comprising:

a first input contact connected to one or more sources of current;

a first summing transistor having an emitter connected to the first input contact;

a first and a second node;

a first output resistor connected between the second node and a collector of the first summing transistor;

a first feedback transistor having a base and a collector that are connected to the emitter and a base of the first summing transistor, respectively;

a first feedback resistor connected between the second node and the collector of the first feedback transistor; and a first output contact connected to the collector of the first summing transistor.

11. The transimpedance amplifier of claim 10, and further comprising a second input contact connected to one or more sources of current.

12. The transimpedance amplifier of claim 11, and further comprising:

a second summing transistor having an emitter connected to the second input contact;

a second output resistor connected between the second node and a collector of the second summing transistor;

a second feedback transistor having a base and a collector that are connected to the emitter and a base of the second summing transistor, respectively;

a second feedback resistor connected between the second node and the collector of the second feedback transistor; and a second output contact connected to the collector of the second summing transistor.

13. The transimpedance amplifier of claim 12, and further comprising:

a current source connected to the first node;

a first supply voltage connected to the second node;

a first bias resistor connected between the first node and an emitter of the first feedback transistor; and a second bias resistor connected between the first node and an emitter of the second feedback transistor.

* * * * *

UNITED STATES PATENT AND TRADEMARK OFFICE
CERTIFICATE OF CORRECTION

PATENT NO. : 5,900,779
DATED : MAY 4, 1999
INVENTOR(S) : JOSEPH D. GIACOMINI

It is certified that error appears in the above-identified patent and that said Letters Patent is hereby corrected as shown below:

Col. 7, line 25, after "node", insert --and--

Col. 7, line 27, after "node", insert --and--

Signed and Sealed this

Twenty-fifth Day of January, 2000

Attest:

Attesting Officer

Acting Commissioner of Patents and Trademarks